United States Patent
Zuck et al.

(10) Patent No.: US 7,328,712 B1
(45) Date of Patent: *Feb. 12, 2008

(54) CLEANING BENCH FOR REMOVING CONTAMINANTS FROM SEMICONDUCTOR PROCESS EQUIPMENT

(75) Inventors: Dwight J. Zuck, Elk Grove, CA (US); David S. Zuck, Coppell, TX (US)

(73) Assignee: Quantum Global Technologies, Dublin, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/128,684

(22) Filed: May 12, 2005

Related U.S. Application Data

(62) Division of application No. 10/622,393, filed on Jul. 18, 2003, now Pat. No. 6,926,016, which is a division of application No. 10/288,404, filed on Nov. 4, 2002, now Pat. No. 6,637,444, which is a division of application No. 09/504,299, filed on Feb. 15, 2000, now Pat. No. 6,530,388.

(51) Int. Cl.
  *B08B 3/04* (2006.01)
(52) U.S. Cl. .................. 134/84; 134/89; 134/135; 134/902
(58) Field of Classification Search .......... 134/71, 134/902
  See application file for complete search history.

(56) References Cited

U.S. PATENT DOCUMENTS

| 16,190 | A | 12/1856 | Roland |
| 17,066 | A | 4/1857 | Morrow |
| 30,331 | A | 10/1860 | Lanham |
| 53,052 | A | 3/1866 | Smith |
| 617,405 | A | 1/1899 | Pett |
| 847,129 | A * | 3/1907 | Sunkle ............... 134/76 |
| 1,141,314 | A | 6/1915 | Caldwell |

(Continued)

FOREIGN PATENT DOCUMENTS

DE  31 29 699  2/1983

(Continued)

OTHER PUBLICATIONS

"Aqueous/Semi-Aqueous Ultrasonic Cleaning System," Bulletin S-1029, Branson Ultrasonics Corporation (1994). 2 pages.

(Continued)

*Primary Examiner*—Frankie L. Stinson
(74) *Attorney, Agent, or Firm*—Silicon Edge Law Group LLP; Arthur J. Behiel

(57) ABSTRACT

Described are cleaning benches and methods for removing contaminant layers from semiconductor process components using small volumes of hazardous liquids and minimizing cross-contamination between components from different deposition chambers. Components to be cleaned are stored within or supported by a dedicated cassette before they are placed in a receptacle of cleaning liquid. The cassette displaces a significant percentage of the receptacle's volume; consequently, only a relatively small volume of cleaning liquid is needed to fully submerge the component. In typical embodiments, the combined cassette and component displace a volume of liquid that is greater than the volume of liquid used to clean the component. The cleaning bench can include different chemical baths for different components. Cassettes dedicated for use with particular components can be keyed to particular receptacles.

18 Claims, 6 Drawing Sheets

U.S. PATENT DOCUMENTS

| | | | | |
|---|---|---|---|---|
| 1,202,154 | A | * | 10/1916 | Blakeslee .................. 134/109 |
| 2,036,261 | A | * | 4/1936 | Dinley ...................... 134/60 |
| 2,191,508 | A | | 2/1940 | Stuart ......................... 95/90 |
| 2,416,475 | A | * | 2/1947 | Friedman ................. 134/58 R |
| 2,860,646 | A | * | 11/1958 | Zucker ..................... 134/111 |
| 2,988,012 | A | * | 6/1961 | Markley et al. ............. 104/93 |
| 3,010,460 | A | | 11/1961 | Leppeau ................... 134/135 |
| 3,077,155 | A | | 2/1963 | Maddock et al. ............. 95/98 |
| 3,121,438 | A | | 2/1964 | Kennedy .................. 134/135 |
| 3,151,620 | A | * | 10/1964 | Kellard ...................... 134/76 |
| 3,680,266 | A | | 8/1972 | Shiplov |
| 3,952,756 | A | | 4/1976 | Sheppard .................. 134/133 |
| 4,302,273 | A | | 11/1981 | Howard, Jr. ............... 156/345 |
| 4,305,413 | A | | 12/1981 | Dougherty .................. 134/90 |
| 4,520,834 | A | * | 6/1985 | DiCicco ..................... 134/63 |
| 4,550,579 | A | | 11/1985 | Clifford ...................... 68/5 C |
| 4,654,910 | A | | 4/1987 | Kusuki et al. |
| 4,965,904 | A | | 10/1990 | Tanaka et al. |
| 5,014,727 | A | | 5/1991 | Aigo ......................... 134/102 |
| 5,088,609 | A | * | 2/1992 | Fryc .......................... 211/117 |
| 5,580,300 | A | | 12/1996 | Tsutsumi |
| 5,660,640 | A | | 8/1997 | Laube .......................... 134/1 |
| 5,697,391 | A | | 12/1997 | Segawa .................. 134/102.2 |
| 5,707,457 | A | * | 1/1998 | Yates ......................... 134/30 |
| 5,851,307 | A | | 12/1998 | Gilmer et al. ............. 134/22.1 |
| 5,906,216 | A | | 5/1999 | Barlet ......................... 135/58 |
| 5,933,902 | A | * | 8/1999 | Frey ........................... 15/102 |
| 6,048,405 | A | | 4/2000 | Skrovan et al. ................ 134/1 |
| 6,055,694 | A | | 5/2000 | Steere .......................... 15/77 |
| 6,217,415 | B1 | | 4/2001 | Ajayi |
| 6,253,775 | B1 | * | 7/2001 | Kitahara et al. ............ 134/108 |
| 6,530,388 | B1 | | 3/2003 | Zuck et al. |
| 6,637,444 | B1 | | 10/2003 | Zuck et al. |

FOREIGN PATENT DOCUMENTS

| | | | |
|---|---|---|---|
| JP | | 8-66451 | 3/1966 |
| JP | | 8-66453 | 3/1966 |
| JP | | 53-136358 | * 11/1978 |
| JP | | 58-109159 | 6/1983 |
| JP | | 1-263287 | 10/1989 |
| JP | | 3-124028 | 5/1991 |
| JP | | 3-246940 | 11/1991 |
| JP | | 5-102121 | 4/1993 |
| JP | | 5-152273 | 6/1993 |
| JP | | 6-271068 | 8/1994 |
| JP | | 9-66190 | 3/1997 |
| KR | | 2002051405 | 12/2000 |

OTHER PUBLICATIONS

"Aqueous Ultrasonic Cleaning System," Bulletin S-1015, Branson Ultrasonics Corporation (1992).

"Aqueous Ultrasonic Cleaning System," Bulletin S-1024A, Branson Ultrasonics Corporation (1993). 2 pages.

"Aqueous Ultrasonic Cleaning System," Bulletin S-1014, Branson Ultrasonics Corporation (1992). 2 pages.

"Microclean Ultrasonic Cleaning Systems, PE Series Cleaning Processes for Precision Engineering Industries." Kerry Ultrasonics Limited (1993). 6 pages.

"Microsolve Ultrasonic Cleaning Systems, Solvent Processes for Precision Cleaning," Kerry Ultrasonics Limited (not dated: obtained in 1999). 6 pages.

"PA-Series™ Aqueous Precision Cleaning Systems," Forward Technology Industries, Inc. (1999). 4 pages.

"SA-Series™ Solvent Precision Cleaning Systems," Forward Technology Industries, Inc. (1999). 4 pages.

"SVG Polyimide Parts Cleaner, Maintenance and Operation Manual," Poly-Flow Engineering, Inc. (1994). 35 pages.

"Endura® PVD Process Kit Catalog," revision C, Applied Materials, Inc. (Oct. 1993). 40 pages.

U.S. Appl. No. 10/622,393, filed Jul. 18, 2003, Zuck et al.

"Electric Immersion Heaters, Heat Exchangers, In-Line Heaters, and Level and Temperature Controls," available from Process Technology of Mentor, Ohio (obtained in 1999). 35 pages.

ESCA Sales Brochure, undated document received Sep. 15, 1999. 17 pages.

"S2-93A Compliance Statement," reference document Ref113, Universal Plastics (1999). 8 pages.

"Products & People . . . Creating Value Through Excellence & Innovation," Universal Plastics, Inc., (undated reference obtained in 1999). 21 pages.

"Safety Design in Parts Cleaning," Poly-Flow Engineering, Inc. (not dated, obtained in 1999). 15 pages.

* cited by examiner

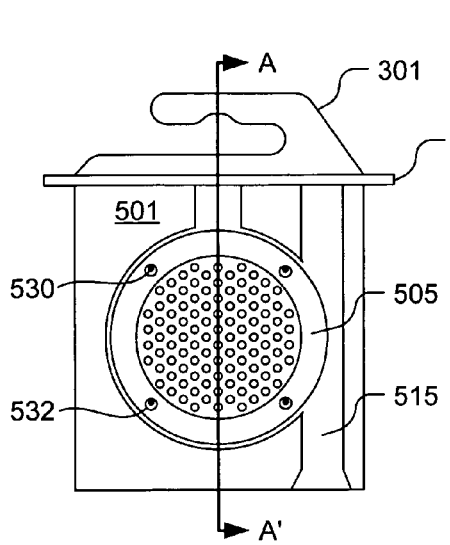
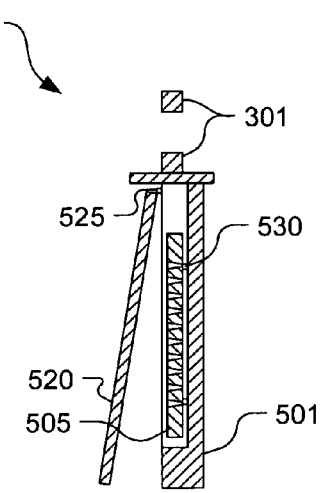
FIG. 5A          FIG. 5B
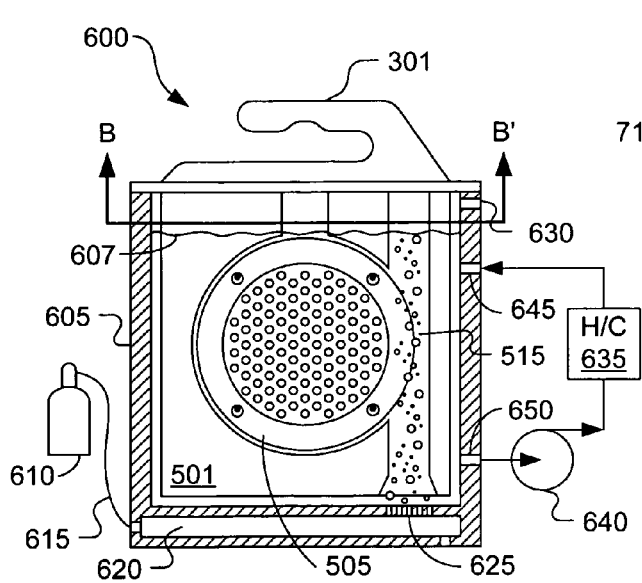
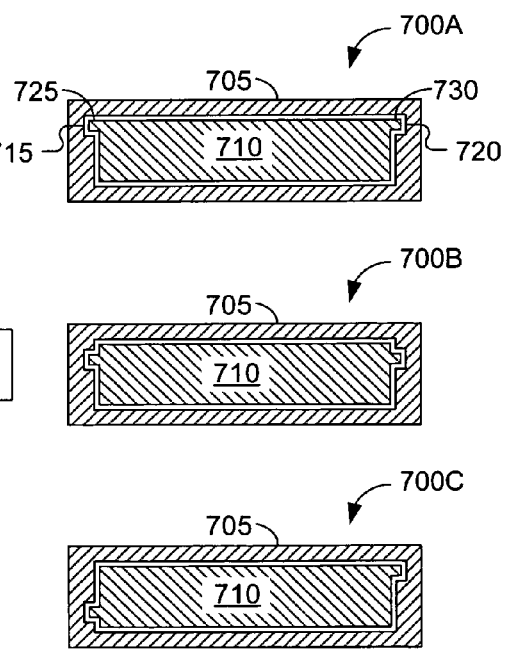
FIG. 6          FIG. 7

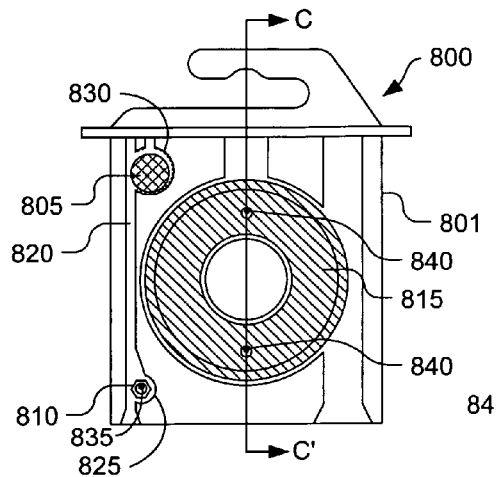 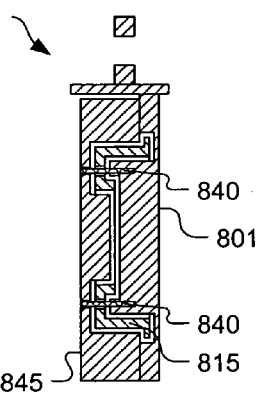
FIG. 8A  FIG. 8B  FIG. 8C
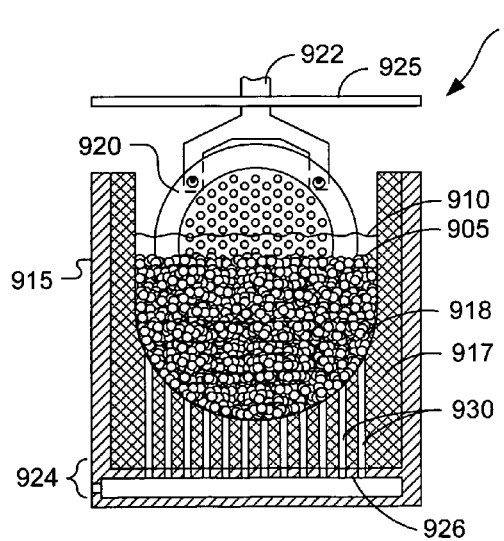 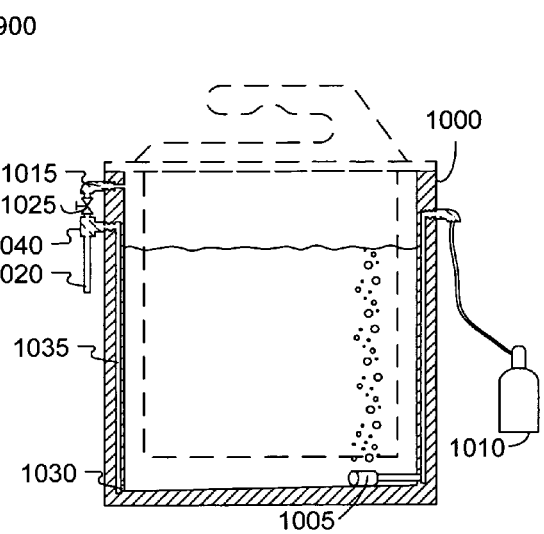
FIG. 9  FIG. 10

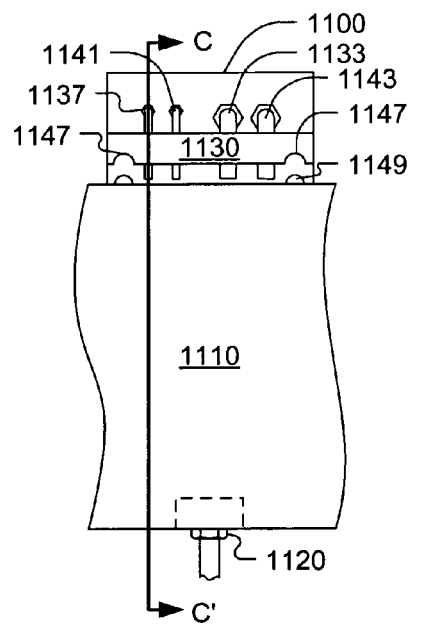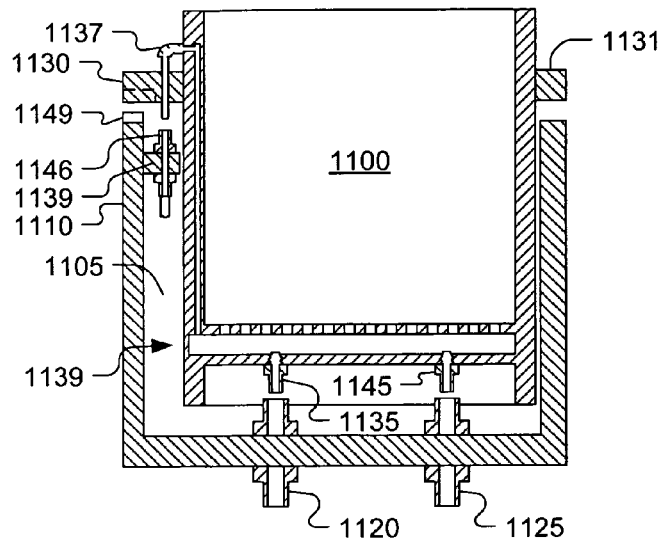
FIG. 11A  FIG. 11B
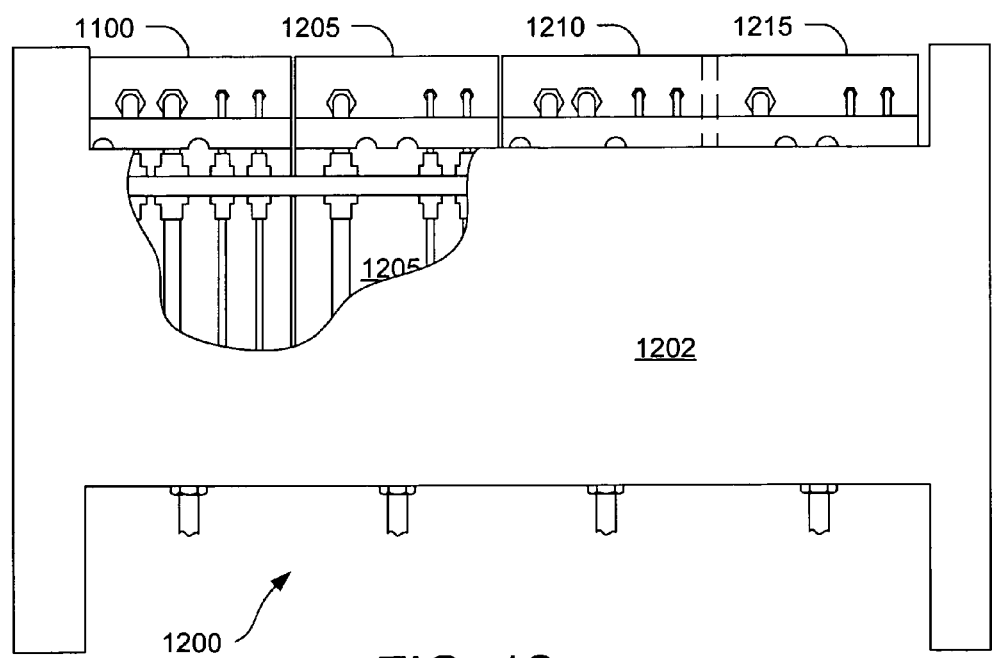
FIG. 12

CLEANING BENCH FOR REMOVING CONTAMINANTS FROM SEMICONDUCTOR PROCESS EQUIPMENT

CROSS REFERENCE TO RELATED APPLICATIONS

This application is a divisional of U.S. patent application Ser. No. 10/622,393, filed Jul. 18, 2003, now U.S. Pat. No. 6,926,016, which was a divisional of U.S. Pat. No. 6,637,444, which was a divisional of U.S. Pat. No. 6,530,388. Each of the above-mentioned references is incorporated herein by reference.

BACKGROUND

Semiconductor devices are built up using a number of material layers. Each layer is patterned to add or remove selected portions to form circuit features that will eventually make up an integrated circuit. Some layers can be grown from another layer; for example, an insulating layer of silicon dioxide can be grown over a layer of silicon by oxidizing the silicon surface. Other layers are formed using deposition techniques, typical ones being chemical vapor deposition (CVD), evaporation, and sputtering.

Deposition methods form layers using vaporized materials that condense to form a film on the surface of interest. Unfortunately, the films thus formed are not limited to the surface of interest, but tend also to form on other surfaces within the reaction chamber. Thus, after substantial use, a thick film of the deposited material accumulates on components and surfaces within the reaction chamber. As the film grows inside the chamber, the film becomes an increasingly troublesome source of contaminants. Etch processes also contaminate inside surfaces of reaction chambers, though by different mechanisms. In either case, the reaction chamber, including internal components, must be periodically cleaned or replaced.

FIG. 1 (Prior Art) depicts a cross-section of a typical cleaning system, or "bench," 100 that may be used to clean semiconductor process equipment. Bench 100 includes a basket 105 and a pair of baths 110 and 115. Bath 110 contains a quantity of solvent, typically a cleaning solution that includes a strong acid or some other hazardous chemical; bath 110 typically contains de-ionized water. One or more components 120 are cleaned by first immersing basket 105 and components 120 in bath 110 and then immersing basket 105 in bath 115 to rinse the solvent from basket 105 and components 120. Other systems clean and rinse components in the same bath. System 100 can be used for general cleaning, or may be dedicated for use with a particular type of cleaning solution. FIG. 1 also includes a parts holder 130, which typifies another type of parts holder used to support horizontally arranged components 135 during immersion.

Bench 100 is simplified for illustrative purposes. Many cleaning systems include other features, such as additional baths, ultrasonic generators, heaters, coolers, spray nozzles, spargers, and electronic controls. For more information on such cleaning systems, see the brochures entitled "PA-Series™ Aqueous Precision Cleaning Systems," and "SA-Series™ Solvent Precision Cleaning Systems," both by Forward Technology Industries, Inc. (1999). These brochures are incorporated herein by reference.

Conventional cleaning systems have many shortcomings, particularly when used with hazardous liquids to clean components that are very sensitive to contamination. For example:

1. hazardous chemicals can be unintentionally mixed, leading to damaged parts, personal injury, or even death, and immersing components in the wrong liquid can lead to similar problems;
2. the treatment and disposal of hazardous liquids and their vapors is dangerous and expensive;
3. permitting requirements grow more burdensome with increased volumes of hazardous materials; and
4. using large quantities of hazardous materials can be a political liability.

To make matters worse, cleaning different components in the same bath can produce unacceptable levels of cross-contamination. Even removing similar materials from similar parts from different manufacturers can be problematic, as the material being removed from a component from one manufacturer may contain contaminants that are unacceptable to other manufacturers. This source of cross-contamination is increasingly problematic, as decreasing device geometries incite chip manufacturers to explore the use of new materials. It is therefore desirable to minimize the volume of hazardous materials used and created when cleaning components, and further to minimize the possibility of cross-contamination between components from different deposition chambers.

SUMMARY

The present invention is directed to cleaning systems and methods that minimize the volume of hazardous materials used and created when cleaning components, and further to minimize the possibility of cross-contamination between components contaminated by different process chemistries.

In accordance with the invention, components to be cleaned are stored within or supported by a dedicated cassette before they are placed in a cleaning receptacle. The cassette is designed to displace a significant percentage of the receptacle's volume so that only a relatively small volume of cleaning liquid is needed to fully submerge the component. This limits the volume of contaminated cleaning solution. In typical embodiments, the cassette displaces a volume that is greater than the volume of liquid used to clean the component.

In one embodiment in which the cleaning receptacle contains only a single unitary cassette containing a single component of a semiconductor processing system, the cassette displaces a cleaning liquid volume of more than 50% of the total volume of the cleaning receptacle, wherein the cleaning liquid is an acid. The acid is taken from the group consisting essentially of: hydrofluoric acid, nitric acid, hydrochloric acid, and phosphoric acid.

Cassettes may include a handle with an attached pommel adapted to cover the receptacle. The pommel protects a user's hand from potentially harmful chemicals and, in some embodiments, covers the chemical bath during the cleaning process. Cassettes may also include different configurations of channels that allow cleaning liquid to enter and exit cavities that surround components. The liquid can be moved through the cassette in any number of ways, including by passing bubbles through the channels.

One embodiment of the invention reduces the requisite volume of cleaning solution using a number of liquid-displacing elements (e.g., balls) contained within a cleaning receptacle. Components to be cleaned are then inserted into a bath comprised of cleaning liquid and the displacement elements. The displacement elements raise the level of liquid within the cleaning receptacle, and thereby reduce the amount of cleaning liquid needed to cover the part. The combined liquid and cleaning elements can then be agitated, as with a sparger or ultrasonic wand.

This summary does not purport to define the invention: the claims define the invention.

BRIEF DESCRIPTION OF THE FIGURES

FIG. 5A is a frontal view of a cassette assembly 500 in accordance with another embodiment.

FIG. 5B is a cross section of cassette assembly 500 taken along line A-A' of FIG. 5A.

FIG. 6 illustrates a cleaning system 600 that includes a receptacle 605 and cassette assembly 500 as described above in connection with FIGS. 5A and 5B.

FIG. 7 includes three top views 700A-C of cleaning systems similar to cleaning system 600 of FIG. 6 taken in cross section along line B-B'.

FIG. 8A is a front view of a cassette assembly 800 in accordance with another embodiment.

FIG. 8B is a cross-sectional view of cassette assembly 800 taken along line B-B' of FIG. 8A and including a cover 845.

FIG. 8C is a cross-sectional view of cassette assembly 800 taken along line B-B' of FIG. 8A and including a cover 845.

FIG. 9 depicts a cleaning system 900 in which a number of liquid-displacing elements (e.g., balls 905) displace a quantity of cleaning liquid 910 contained within a receptacle 915.

FIG. 10 is a cross-section of a receptacle 1000 in accordance with another embodiment.

FIG. 11A is a frontal view of a receptacle 1100 inserted within a secondary containment vessel 1105 of a cleaning bench 1110.

FIG. 11B is a cross-sectional side view of receptacle 1100 and vessel 1105 taken along line C-C' of FIG. 11A.

FIG. 12 depicts a cleaning station 1200 that includes four receptacles placed within a secondary containment vessel 1202.

DETAILED DESCRIPTION

Figure 2A:
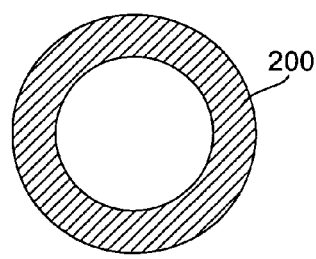
FIG. 2A (prior art) is a front view of an exemplary component 200 that must be cleaned.
Figure 2B:
FIG. 2B (prior art) is a side view of component 200 of FIG. 2A.

FIGS. 2A and 2B (prior art) are respective front and side views of an exemplary component 200 that must be cleaned. In one embodiment, component 200 is a titanium clamp ring used in a titanium-nitride sputter deposition process, and consequently contaminated with a layer of titanium nitride. The titanium nitride layer can be removed using a cleaning procedure that includes immersing component 200 in an etching solution of nitric acid, hydrochloric acid, and de-ionized water. Component 200 might otherwise be any of myriad other parts to be cleaned using solutions well known to those of skill in the art. For detailed recipes describing how to clean various components, including a discussion relating particularly to removing titanium nitride from a titanium clamp ring, see "Endura® PVD Process Kit Catalog," revision C, Applied Materials, Inc. (1992), which is incorporated herein by reference.

Figure 1:
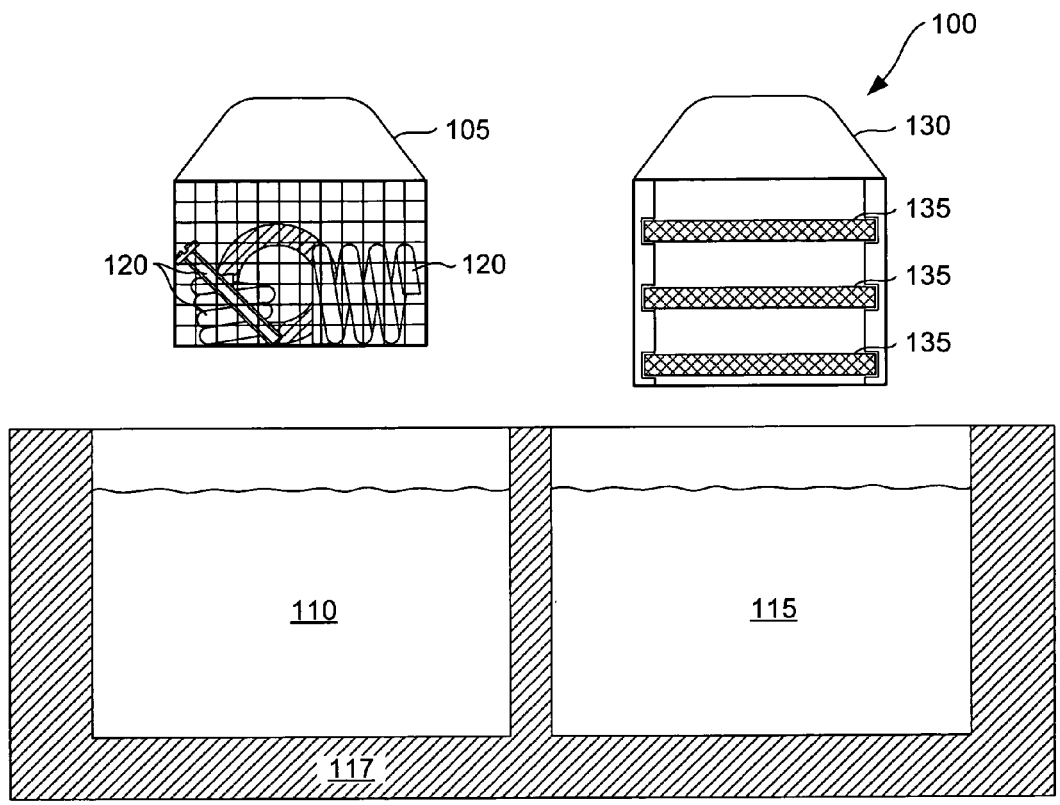
FIG. 1 (Prior Art) depicts a cross-section of a typical cleaning system, or "bench," 100 that may be used to clean semiconductor process equipment.

Referring again to FIG. 1, if dipped in bath 110, component 200 displaces a volume that is small in proportion to the total amount of cleaning solution. This disproportionately large volume of cleaning solution is much more than is typically needed to clean a component; consequently, the amount of contaminated solution is unnecessarily large. The present invention addresses this wasteful practice using systems that minimize the amount of solution required to clean a given component or a given set of components.

Figure 3A:
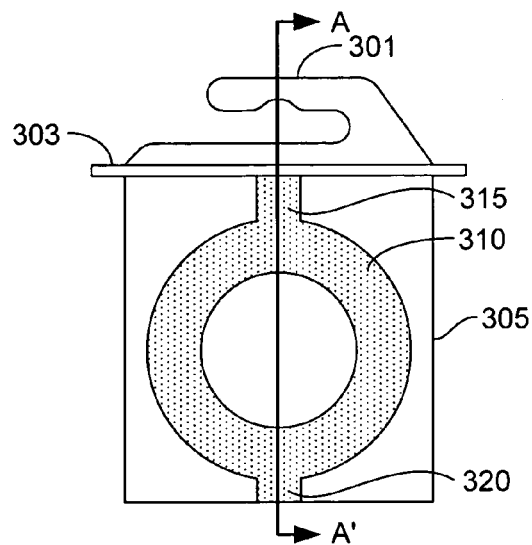
FIG. 3A depicts a cassette 300 for supporting component 200 of FIGS. 2A and 2B during immersion in a bath of cleaning liquid.
Figure 3B:
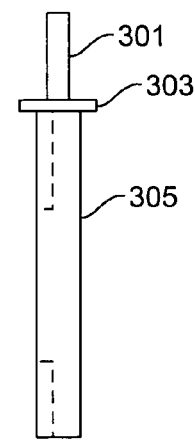
FIG. 3B is a side view of cassette 300 of FIG. 3A.
Figure 3C:
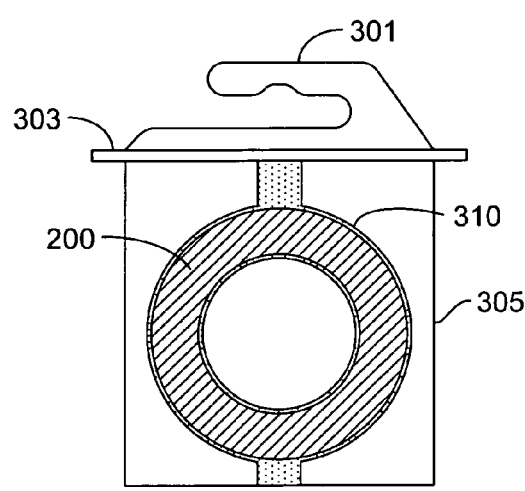
FIG. 3C is a front view of a component 200 placed within a cassette 300.

FIG. 3A depicts a cassette 300 for supporting component 200 of FIGS. 2A and 2B during immersion in a bath of cleaning liquid. Cassette 300 includes a handle 301 and a pommel 303. Handle 301 doubles as a hook for storing cassette 300 suspended from a storage rack (see FIGS. 13A and 13B). Pommel 303 protects a user's hand from potentially harmful chemicals and, in some embodiments, covers the chemical bath while component 200 is immersed. Cassette 300 also includes a cassette body 305 within which is formed a cavity 310 designed to accommodate component 200, as shown in FIG. 3C. Cavity 310 is a space within which to fit component 200. Cavity 310 includes a pair of vertical channels 315 and 320. These channels allow bubbles and liquid to move through cavity 310 when immersing cassette 300 or, as discussed in connection with FIG. 6 below, when using a sparger to facilitate cleaning.

Figure 4:
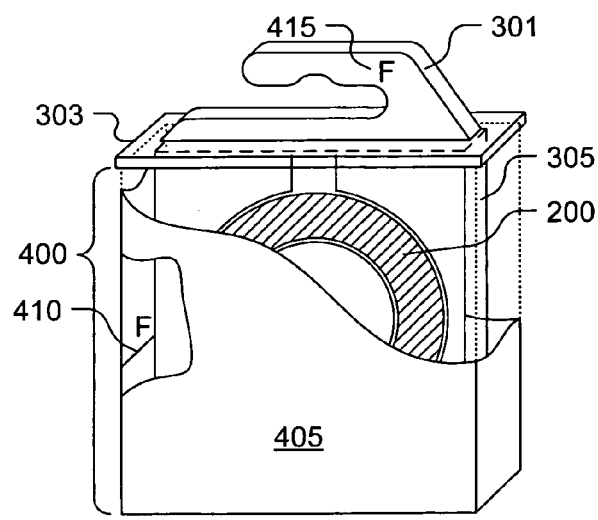
FIG. 4 depicts cassette 300 and component 200 in a cleaning bath 400.

FIG. 4 depicts cassette 300 and component 200 inserted within a cleaning bath 400. Bath 400 includes a receptacle 405 partially filled with a cleaning liquid (not shown). When inserted, cassette body 305 displaces a significant volume of the cleaning liquid, and thereby minimizes the amount of liquid needed to clean component 200. In typical embodiments, the cassette displaces a volume that is greater than the volume of liquid used to clean the component. In such embodiments, the cassette displaces a volume that is greater than 50% of the total receptacle volume.

Cavity 310 should be shaped in much the same way as component 200 for maximum liquid displacement; however, cavity 310 may be any shape that accommodates component 200. Pommel 303 covers receptacle 400 to contain vapors and liquid. Cavity 310 can be textured or can include spacers that allow liquid to move between component 200 and cassette 300.

Cassette 300 and receptacle 405 are preferably formed of some material that does not dissolve or react when exposed to cleaning solutions and chemicals for use with those devices. In an embodiment used with nitric and hydrochloric acids, for example, cassette 300 and receptacle 405 are both of polypropylene or PVDF. Appropriate materials for use with various cleaning chemicals are well known to those of skill in the art.

In the depicted embodiment, receptacle 405 includes a fill line 410, marked with "F" in the example, visible on the inside of receptacle 405. Fill line 410 indicates the correct fill level of receptacle 405. Fill line 410 and any other demarcations within receptacle 405 should be formed of a material that will not contaminate or dissolve in the relevant cleaning liquid.

Cassette 300 includes a mark 415 similar to that identifying fill line 410. Operators can therefore fill receptacle 405 to the correct level for cassette 300 by matching markings 410 and 415. This marking scheme does not include any numbers, eliminating potential math errors that might cause an accidental overfill—and consequent overflow—of receptacle 405. In other embodiments, receptacle 405 includes additional volumetric graduations corresponding to other cassette/component combinations. In still other embodiments, the same or a different demarcation on a given cassette identifies the type of component to be cleaned using that cassette. This configuration reduces the possibility of cross contamination.

FIG. 5A depicts a frontal view of a cassette assembly 500 in accordance with another embodiment; FIG. 5B is a cross section of cassette assembly 500 taken along line A-A' of FIG. 5A. Cassette 501 of assembly 500 includes handle 301 and pommel 303 of FIG. 3. Cassette 501 is designed to accommodate a component 505 that differs from component 200, emphasizing that cassettes can be adapted for use with components of different shapes. Of course, the combined cassette and component must fit within the chosen receptacle, but receptacles can be enlarged as necessary. Cassette 501 additionally includes a channel 515 and, as shown in FIG. 5B, a component cover 520 fastened to the body of cassette 501 using a hinge 525 or some other fastener. In one embodiment that does not use a hinge, pins 530 extend from cassette 501 into cover 520. Other embodiments include more or fewer pins that extend from cassette 501 into cover 520, or vice versa.

Cover 520 keeps component 505 from falling out and displaces liquid, further limiting the requisite amount for cleaning component 505. Where cassette 300 is thin or short relative to the corresponding receptacle, additional liquid-displacing elements can be inserted into the receptacle along with cassette 300. For example, where a cassette is thinner than the corresponding receptacle, a board similar to cover 520 can be inserted into the receptacle adjacent cassette 300. Or, a volume-displacing element can be fitted into the bottom of a receptacle.

Each cassette/component combination can be designed to displace the same amount of liquid. Such a design simplifies cleaning procedures because the appropriate fill level is the same regardless of the part to be cleaned. It may be necessary, however, to design particular cassette/component combinations so that the liquid displacement allows sufficient liquid in the corresponding receptacle to completely clean the component. These considerations may require stoichiometric calculations that take into account the type and amount of material to be removed, the concentration of the solution, and the temperature of the bath. Such calculations are within the skill of those in the art.

In the depicted example, four pins 530 extend through corresponding holes 532 to support component 505. In the example, component 505 is a "shower head" for dispensing gas in a deposition chamber. During a deposition process, bolts extend through holes 530 so layers of deposited material do not accumulate within holes 532. In other words, holes 532 are "non-process-wetted" areas. Thus, the contact between pins 530 and the inside of holes 532 does not interfere with the cleaning process. Where possible, cassettes should be designed to support components at points that need not be cleaned. Alternatively, cassettes can be designed so that a part can be repositioned one or more times to ensure uniform cleaning of contact areas.

FIG. 6 illustrates a cleaning system 600 that includes a receptacle 605 and cassette assembly 500 of FIGS. 5A and 5B. Receptacle 605 contains sufficient cleaning liquid 607 to cover component 505. Pommel 303 completely covers receptacle 605 to protect operators from splashed chemicals and to contain vapors. Receptacle 605 is depicted in cross-section for illustrative purposes.

Receptacle 605 connects to a gas source 610, typically a nitrogen bottle, via a line 615 and other conventional gas-flow control devices. Gas from line 615 flows through a sparger—in this case a cavity 620 with perforations 625—to create bubbles that float up through channel 515. The bubbles facilitate cleaning by inducing the cleaning liquid to circulate in a plane parallel to the face of component 505. A vent 630 allows the nitrogen gas to escape, and is vented to a vapor scrubber if necessary.

Some cleaning procedures require liquid 607 be heated or cooled. Receptacle 605 is therefore connected to a heating/cooling unit 635 and a pump 640 via a pair of ports 645 and 650. Liquid 607 circulates through heating/cooling unit 635 as necessary to maintain any desired temperature. Other methods of heating and cooling liquids may also be used, as is well known to those of skill in the art. For examples, see "Electric Immersion Heaters, Heat Exchangers, In-Line Heaters, and Level and Temperature Controls," available from Process Technology of Mentor, Ohio (undated material obtained in 1999), which is incorporated herein by reference.

FIG. 7 includes three top views 700A-C of cleaning systems similar to cleaning system 600 of FIG. 6 taken in cross section along line B-B'. View 700A depicts a receptacle 705 within which is disposed a cassette 710. Receptacle 705 includes a pair of vertically disposed slots 715 and 720; cassette 710 includes a corresponding pair of rails 725 and 730. Views 700B and 700C show receptacle/cassette combinations that are similarly keyed, but with different placement of the corresponding slots and rails. The keying prevents operators from inadvertently inserting a cassette into the wrong receptacle. This is important to avoid cross contamination between components and to avoid damage to cassettes and components that may result if they are exposed to the wrong chemicals.

FIG. 8A is a front view of a cassette assembly 800 in accordance with another embodiment. Cassette assembly 800 includes a cassette 801 that compares with cassette 501 of FIG. 5A, but is modified to store three components 805, 810, and 815. Cassette assembly 800 shows that cassettes can be adapted to clean a number of components simultaneously. Such embodiments are particularly useful, for example, when cleaning a set of components of similar substrate material taken from a single deposition chamber.

An additional channel 820 and a pair of cavities 825 and 830 allow liquid to flow over components 805 and 810. A pin 835 suspends component 810; cavity 830 is textured to allow liquid to surround component 805. Two pins 840 extend through holes in support component 815.

FIG. 8B is a cross-sectional view of cassette assembly 800 taken along line C-C' of FIG. 8A. FIG. 8B depicts a matching cover 845 of cassette 801 that fits over pins 840 to mate with the opposing portion of cassette 801, as shown in FIG. 8C. Matching cover 845 displaces additional liquid volume and channels cleaning liquid around the various components. The cleaning liquid can be channeled through cover 845, cassette 801, or both. Pumps, convection, or sparged gas (e.g., nitrogen) can be employed to move the cleaning liquid.

FIG. 9 depicts a cleaning system 900 in which a number of liquid-displacing elements 905 (e.g., marbles) displace a quantity of cleaning liquid 910 contained within a receptacle 915. An additional liquid-displacing element 917 fitted to receptacle 915 displaces even more cleaning liquid, and defines a cavity 918 adapted to receive component 920. A component 920 is suspended by a support 922 that includes a pommel 925 to protect operators from splashes and to cover receptacle 915.

Element 917 creates a semi-circular bottom for receptacle 915 that matches the shape of component 920. Element 917 is not limited to the depicted shape, but can be adapted to fit other components. Moreover, element 917 can be adapted for use with cassettes like those described above to reduce the weight and size of the cassettes. For example, cassette body 305 of FIGS. 3A-3C can be divided in two along a horizontal axis and the bottom half installed in receptacle 405 of FIG. 4. The remaining top portion of cassette body 305 can then be used to immerse component 200 as described above in connection with FIG. 4. In this embodiment, the bottom half of cassette body 305 can be considered either part of the receptacle or part of the cassette. Such embodiments reduce the weight and the portion of the cassette used to convey components, and further reduce the total volume of the receptacle. In some embodiments, element 917 is not an insert, but is instead formed as part of receptacle 915.

Elements 905 raise the level of liquid to reduce the amount of liquid required to submerge component 920. Receptacle 915 includes a sparger 924 in which a row of gas ports 926 extends across the bottom of receptacle 915. Element 917 includes a corresponding row of gas ports 930. Running a gas through sparger 924 produces bubbles that agitate the liquid, increasing cleaning efficiency, and separates elements 905 to ease insertion of components. Liquid-displacing elements 905 and 917 are made of a material that will not react with the liquid. Exemplary materials include Delrin™, Nylon™, Teflon™, and Vespel™. The density of the selected balls is preferably greater than the liquid. In some embodiments, differently sized liquid-displacing elements, such as balls of various diameters, increase displacement.

FIG. 10 is a cross-section of a receptacle 1000 in accordance with another embodiment. Receptacle 1000 includes a sparger 1005, such as an airstone, connected to a gas source 1010. Receptacle 1000 also includes a vent 1015 connected to an exhaust line 1020 via a valve 1025. The floor of receptacle 1000 slopes to create a low point at which is located a drain 1030. Drain 1030 connects to exhaust line 1020 via a channel 1035 and a T-fitting 1040.

Exhaust line 1020 leads to an exhaust duct or to a properly ventilated reservoir (not shown) that stores spent cleaning liquid. Valve 1025 is open during cleaning to allow gas from source 1010 to safely escape to the reservoir. Spent cleaning liquid can then be drained from receptacle 1000 by closing valve 1025. Pressure within receptacle 1000 then forces liquid up and out through drain 1030, channel 1035, T-fitting 1040, and exhaust line 1020. This drain configuration advantageously eliminates potentially hazardous leaks that may occur when liquid can drain from receptacle 1000 at some point below the level of the liquid.

FIG. 11A is a frontal view of a receptacle 1100 inserted within a cleaning bench 1105; FIG. 11B is a cross-sectional side view of receptacle 1100 taken along line C-C' of FIG. 11A. Receptacle 1100 includes a secondary containment vessel 1110 that supports a pair of female drain connectors 1120 and 1125. Receptacle 1100 can be removed from the cleaning station and replaced with another receptacle with similar fittings. Containment vessel 1110 accommodates liquid from leaks, spills, and accidental overflows. In one embodiment, containment vessel 1110 holds 110% of the combined volumes of all receptacles placed within containment vessel 1110.

Receptacle 1100 includes a pair of bars 1130 and 1131 that rest upon edges of vessel 1105 to support receptacle 1100. The depicted receptacle is for use with acid baths, and consequently includes an acid inlet 1133 and an acid drain 1135. Receptacle 1100 also includes a gas inlet 1137 for supplying a gas (e.g., nitrogen) to a sparger 1139 and a vent 1141 for exhausting vapors. Receptacle 1100 can be rinsed of acids and contaminants using a water inlet 1143 and a water drain 1145'. Other embodiments use a single inlet/drain pair for both acids and water.

Vessel 1110 includes female couplings for each inlet, vent, and drain of receptacle 1100. For example, gas inlet 1137 fits within a female connector 1146 mounted on a rail 1139 inside vessel 1110, and drains 1135 and 1145 fit within drain connectors 1120 and 1125. These couplings disconnect easily to facilitate removal and replacement of receptacle 1100. In one embodiment, the various male and female connectors are compression slip fittings, such as John Guest™ fittings available from Ryan Herco Products Corporation of Burbank, Calif. John Guest™ fittings include an o-ring that may have to be substituted for a material that does not degrade when in contact with the cleaning liquid of choice.

Bar 1130 includes recesses 1147 that are keyed to opposite protrusions 1149 on support vessel 1110. These recesses and protrusions are configured so that different types of receptacles cannot be placed in the wrong portion of the cleaning station. This is an important feature, as introducing the wrong chemical can damage the receptacle, the component being cleaned, or even pose a risk to the operator. Recesses 1147 and protrusions 1149 also aid in aligning receptacle 1100 to simplify connecting the various male and female couplings, which must be positioned to ensure that chemicals drain into the appropriate disposal reservoirs.

Each inlet and drain depicted in the various embodiments is plumbed with appropriate valves to move liquid and gas to affect a desired cleaning process. All of the plumbing fixtures should be compatible with the conveyed liquid. Liquid conveyance can be automated using solenoid-activated valves and control systems. Likewise, conveyance of the cassettes and components can likewise be automated (e.g., using robotics) for safety and ease of use. Such control systems and plumbing are well understood by those of skill in the art, and are therefore omitted here for brevity.

One or more receptacles like the ones described above can be placed in a single cleaning bench. The vertical orientation (i.e., the height is greater than the width) of these receptacles allows for space-efficient placement, enabling a single bench to simultaneously clean different types of components in different tanks. Benches are often used to clean components from more than one customer, and typically to remove more than one type of contaminant. Moreover, typical contaminant layers include many species. For example, one customer might require that a titanium nitride layer be removed from stainless steel, while another customer might require that tungsten be removed from aluminum. Cross-contamination is an important consideration in such situations. Parts cleaners can minimize cross-contamination by using dedicated cassettes and receptacles to clean components sensitive to cross-contamination. Also advantageous, a single cleaning bench in accordance with the invention can use separate receptacle/cassette combinations to simultaneously clean different components using different chemistries.

FIG. 12 depicts a cleaning station 1200 that includes four receptacles placed within a secondary containment vessel 1202. The first is receptacle 1100 of FIGS. 11A and 11B. The second receptacle 1205 is keyed differently than receptacle 1100, and includes one fewer inlets and one fewer drains. Receptacle 1205 does not include an acid inlet or acid drain because receptacle 1205 is intended for use only with de-ionized water. The third and fourth receptacles 1210 and 1215 are joined. Such matched pairs of receptacles can be used to clean dedicated components or sets of components to reduce the possibility of cross contamination. For example, a matched pair of receptacles and a corresponding cassette might be used to clean only those components taken from a particular deposition chamber. Receptacles can also be combined without a separation between them to accommodate larger parts.

The width of each receptacle in FIG. 12 is a multiple of some minimum width. While this need not be the case, this scheme provides for efficient use of bench space and simplifies alignment of the various ports. The system can easily be adapted to accommodate larger baths.

Figure 13A:
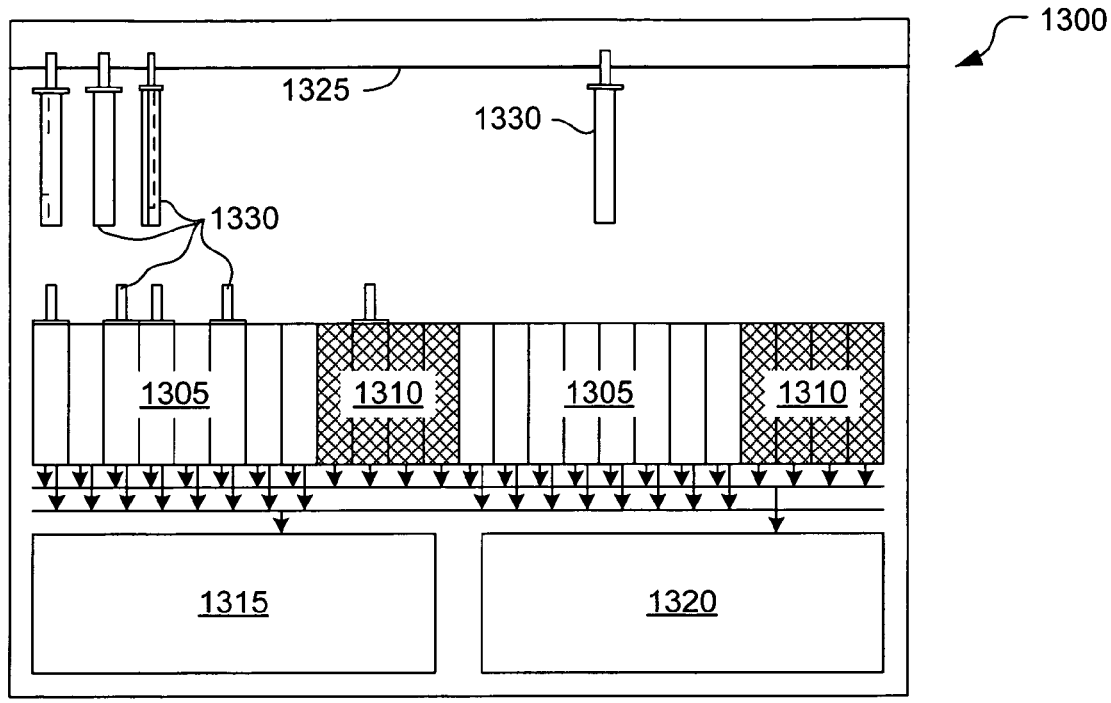
FIGS. 13A and 13B depict respective front and side views of a cleaning system 1300.
Figure 13B:
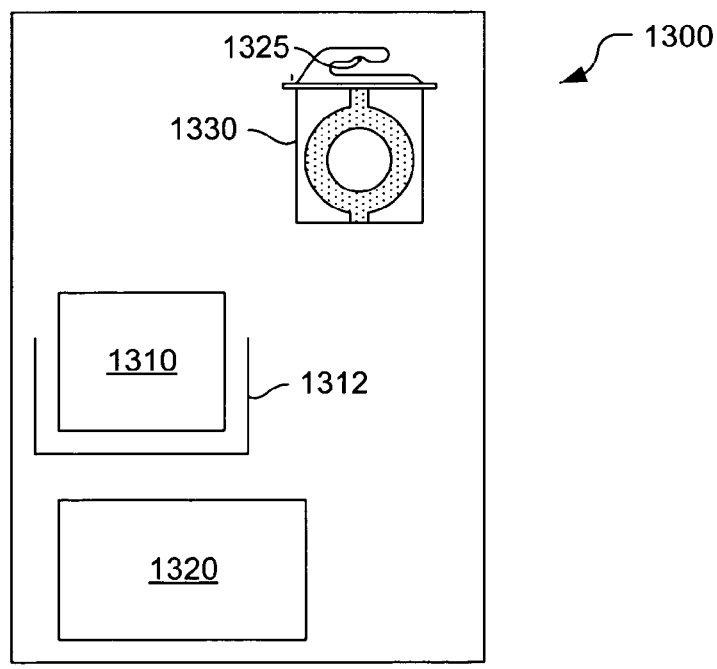

FIGS. 13A and 13B depict respective front and side views of a cleaning system 1300. System 1300 includes two banks of cleaning-solution receptacles 1305 and two banks of rinse receptacles 1310. Each of the cleaning-solution receptacles is disposed within a secondary containment vessel 1312. The receptacles and the secondary containment vessel drain to a reservoir 1315 adapted to contain waste liquid and to a reservoir 1320 adapted to contain contaminated wastewater used for post-clean rinsing. Each of the rinse receptacles drains only to reservoir 1320. As depicted in FIG. 12, the various receptacles also include various inlets and vents; however, these are omitted here for brevity.

Cleaning system 1300 includes one or more racks 1325 upon which may be hung cassettes 1330 like those described above. Rack 1325 may be used for drying or storage. A tray (not shown) disposed below rack 1325 conveys runoff to an appropriate container, such as reservoir 1315. Additional trays may be positioned below the receptacles to similarly deal with leaks or spills. Furthermore, the entire cleaning system 1300 can be enclosed and vented to protect workers from hazardous vapors and spills. If sealed, the housing of cleaning system 1300 is a tertiary vessel that contains spills and leaks. Secondary containment vessel 1312 should be designed to contain at least 110% of the combined volumes of all of the receptacles, and cleaning system 1300 should be designed to contain at least 110% of the volume of secondary containment vessel 1312. In an embodiment that affords a particularly high degree of safety, the working area surrounding receptacle banks 1305 and 1310 is enclosed in a glove box. This design affords primary and secondary containment of any fumes, enhancing operator safety.

While the present invention has been described in connection with specific embodiments, variations of these embodiments will be apparent. For example, cassettes and receptacles in accordance with the invention can incorporate ultrasonic generators to agitate cleaning solutions. Typical ultrasonic generators are available from Lewis Corporation of Oxford, Conn., and Miraclean™ of Ashville, N.Y. Moreover, cassettes may be adapted to include a conductive connection to support some cleaning procedures that require an electrical connection to the component being cleaned. Therefore, the spirit and scope of the appended claims should not be limited to the foregoing description.

What is claimed is:

1. A cleaning bench comprising:
   a. a unitary first receptacle receiving a first component of a first component shape and a first volume of a first liquid, the first liquid selected to remove a first contaminant layer from the first component, the first receptacle having a first receptacle shape similar to at least a portion of the first component shape, wherein the first receptacle includes a cassette defining at least a portion of the first receptacle shape; and
   b. a unitary second receptacle receiving a second component of a second component shape and a second volume of a second liquid, the second liquid selected to remove a second contaminant layer from the second component, the second receptacle having a second receptacle shape similar to at least a portion of the second component shape.

2. The cleaning bench of claim 1, wherein the first component shape differs from the second component shape.

3. The cleaning bench of claim 1, wherein the cassette encloses the first component within the first receptacle.

4. The cleaning bench of claim 3, wherein the cassette is textured to allow the first liquid access to the surface of the first component.

5. The cleaning bench of claim 1, wherein the first and second receptacles include include respective first and second inlets admitting the respective first and second volumes of liquid.

6. The cleaning bench of claim 1, further comprising first and second waste reservoirs, the first receptacle including a first drain to the first reservoir and the second receptacle including a second drain to the second reservoir.

7. The cleaning bench of claim 6, wherein each of the first and second reservoirs includes a respective vent.

8. The cleaning bench of claim 1, wherein the first and second receptacles are uniquely keyed within the bench.

9. The cleaning bench of claim 1, wherein the cassette is keyed to just one of the first and second receptacles.

10. The cleaning bench of claim 9, wherein the cassette encloses the first component within the first receptacle.

11. The cleaning bench of claim 1, wherein the first component shape is substantially circular.

12. The cleaning bench of claim 11, wherein the first and second components are semiconductor process equipment.

13. A cleaning bench comprising:
   a. a unitary first receptacle receiving a first component of a first component shape and a first volume of a first liquid, the first liquid selected to remove a first contaminant contaminant layer from the first component, the first receptacle having a first receptacle shape similar to at least a portion of the first component shape, wherein the first contaminant layer is disposed over a substrate material, and wherein the first receptacle includes a mark identifying at least one of the first liquid, the first component, and the substrate material; and
   b. a unitary second receptacle receiving a second component of a second component shape and a second volume of a second liquid, the second liquid selected to remove a second contaminant layer from the second component, the second receptacle having a second receptacle shape similar to at least a portion of the second component shape.

14. A cleaning bench comprising:
   a. a unitary first receptacle receiving a first component of a first component shape and a first volume of a first liquid, the first liquid selected to remove a first contaminant layer from the first component, the first receptacle having a first receptacle shape similar to at least a portion of the first component shape;
b. a handle supporting the first component in the first receptacle, the handle including a pommel adapted to cover the first receptacle; and
c. a unitary second receptacle receiving a second component of a second component shape and a second volume of a second liquid, the second liquid selected to remove a second contaminant layer from the second component, the second receptacle having a second receptacle shape similar to at least a portion of the second component shape.

15. A cleaning bench comprising:
a. a unitary first receptacle receiving a first component of a first component shape and a first volume of a first liquid, the first liquid selected to remove a first contaminant layer from the first component, the first receptacle having a first receptacle shape similar to at least a portion of the first component shape;
b. a unitary second receptacle receiving a second component of a second component shape and a second volume of a second liquid, the second liquid selected to remove a second contaminant layer from the second component, the second receptacle having a second receptacle shape similar to at least a portion of the second component shape; and
c. a plurality of cassettes for insertion into the first and second receptacles and a rack for hanging the cassettes.

16. A cleaning bench comprising:
a. a first receptacle receiving a first component of a first component shape and a first volume of a first liquid, the first liquid selected to remove a first contaminant layer from the first component, the first receptacle having a first receptacle shape similar to at least a portion of the first component shape;
b. a second receptacle receiving a second component of a second component shape and a second volume of a second liquid, the second liquid selected to remove a second contaminant layer from the second component, the second receptacle having a second receptacle shape similar to at least a portion of the second component shape;
c. means for displacing, in combination with the first component, at least half the first receptacle volume; and
d. means for displacing, in combination with the second component, at least half the second receptacle volume.

17. The cleaning bench of claim 16, wherein the first component shape is substantially circular.

18. The cleaning bench of claim 17, wherein the first and second components are semiconductor process equipment.

* * * * *

UNITED STATES PATENT AND TRADEMARK OFFICE
CERTIFICATE OF CORRECTION

| | | |
|---|---|---|
| PATENT NO. | : 7,328,712 B1 | Page 1 of 1 |
| APPLICATION NO. | : 11/128684 | |
| DATED | : February 12, 2008 | |
| INVENTOR(S) | : Dwight J. Zuck and David S. Zuck | |

It is certified that error appears in the above-identified patent and that said Letters Patent is hereby corrected as shown below:

Column 6, Line 54 the word --of-- should be added after the word "support".
Column 8, Line 12 the numbers "1145'" should be changed to --1145--.
Column 10, Line 26 one of the words "include" should be deleted; Lines 48-49 one of the words "contaminant" should be deleted.

Signed and Sealed this

Twenty-fourth Day of June, 2008

JON W. DUDAS
*Director of the United States Patent and Trademark Office*